United States Patent
Calafut et al.

(10) Patent No.: US 7,768,034 B2
(45) Date of Patent: Aug. 3, 2010

(54) TAPERED VOLTAGE POLYSILICON DIODE ELECTROSTATIC DISCHARGE CIRCUIT FOR POWER MOSFETS AND ICS

(75) Inventors: Daniel S. Calafut, San Jose, CA (US); Hamza Yilmaz, Saratoga, CA (US); Steven Sapp, Felton, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 401 days.

(21) Appl. No.: 11/865,191

(22) Filed: Oct. 1, 2007

(65) Prior Publication Data
US 2008/0087963 A1    Apr. 17, 2008

Related U.S. Application Data

(60) Provisional application No. 60/848,252, filed on Sep. 29, 2006.

(51) Int. Cl.
*H01L 23/62* (2006.01)
(52) U.S. Cl. .................. 257/173; 257/356; 257/363; 257/E29.335
(58) Field of Classification Search ................. 257/173, 257/356, 363, E29.335
See application file for complete search history.

(56) References Cited

U.S. PATENT DOCUMENTS

| | | | |
|---|---|---|---|
| 5,514,608 A | 5/1996 | Williams et al. | |
| 5,602,046 A | 2/1997 | Calafut et al. | |
| 5,767,500 A | 6/1998 | Cordes et al. | |
| 5,798,573 A | 8/1998 | Saganovsky | |
| 5,973,359 A | 10/1999 | Kobayashi et al. | |
| 6,172,383 B1 | 1/2001 | Williams | |
| 6,229,180 B1 * | 5/2001 | Yoshida et al. | 257/355 |
| 6,906,386 B2 * | 6/2005 | Williams et al. | 257/355 |
| 2005/0133839 A1 | 6/2005 | Okushima | |

OTHER PUBLICATIONS

Vinson, James E. and Liou, Juin J. "Electrostatic Discharge in Semiconductor Devices: An Overview," IEEE, vol. 86, No. 2, Feb. 1998, pp. 399-418.

* cited by examiner

*Primary Examiner*—Lex Malsawma
(74) *Attorney, Agent, or Firm*—Thomas R. FitzGerald, Esq.; Hiscock & Barclay, LLP

(57) ABSTRACT

An electrostatic discharge (ESD) protection network for power MOSFETs includes parallel branches, containing polysilicon zener diodes and resistors, used for protecting the gate from rupture caused by high voltages caused by ESD. The branches may have the same or independent paths for voltage to travel across from the gate region into the semiconductor substrate. Specifically, the secondary branch has a higher breakdown voltage than the primary branch so that the voltage is shared across the two branches of the protection network. The ESD protection network of the device provides a more effective design without increasing the space used on the die. The ESD protection network can also be used with other active and passive devices such as thyristors, insulated-gate bipolar transistors, and bipolar junction transistors.

13 Claims, 8 Drawing Sheets

TAPERED VOLTAGE POLYSILICON DIODE ELECTROSTATIC DISCHARGE CIRCUIT FOR POWER MOSFETS AND ICS

CROSS-REFERENCE TO RELATED APPLICATIONS

This application claims the benefit of U.S. Provisional Patent Application Ser. No. 60/848,252 filed Sep. 29, 2006.

FIELD OF THE INVENTION

This invention relates to semiconductor devices, and, specifically, to a protection network for dealing with voltage and current waveforms created from electrostatic discharge (ESD) events.

BACKGROUND

Electrostatic Discharge (ESD) presents a special problem for semiconductor devices and particularly for metal oxide semiconductor (MOS) types of structures. The high voltage transient signal from a static discharge can bias an object with more than 10,000 volts and several amps of peak current. The unique hazard in MOS devices is the high electric field that can develop across a relatively thin gate dielectric used in the normal course of operation of the device. The gate dielectric, which is often oxide, can rupture under high electric field conditions, when the charge built up on the gate ruptures the gate oxide which normally acts as an insulator. The effects of the permanent damage caused by the rupture may not be immediately apparent; therefore, the possibility of gate oxide rupture constitutes a realistic reliability concern.

Common power MOSFETs have no protection against ESD or other excessive voltage signals applied to the gate. Silicon dioxide ($SiO_2$) is often used as the gate dielectric in MOS devices. Typically, the rupture voltage for $SiO_2$ can be as high as 10,000,000 Volts per centimeter. Modern MOS devices may have operational gate oxide of 400 Angstroms thickness. Therefore, the realistic rupture voltage for such a device is only about 40 V. One of the primary causes of ESD is contact with the human body during product assembly or maintenance. The "human body model" for ESD conditions typically involves a resistor in series with a capacitor. In the human body model (HBM), the effective body capacitance is charged to several thousand volts through even the simplest interaction with the environment. It is this charge that must be dissipated in the device. Thus, the human body appears to the power device as a high voltage battery during an ESD event.

Because ESD conditions are common in many working environments, many commercial MOS devices are equipped with self-contained ESD protection systems. These can be discrete or integrated with the main functional circuitry.

One method for protecting the gate of the devices from voltage above the oxide breakdown employs back-to-back diodes constructed in the polysilicon gate and then connected between the gate, source and/or drain terminals. This method is effective in improving the ESD rating of the MOSFET gate, and for avoiding over voltage damage. However, gate-source leakage current increases significantly since diodes constructed in polysilicon have much greater leakage current than in monocrystalline silicon. Maximum gate leakage current typically increases from 100 nanoamps to 10 microamps using this method. Some manufacturers have constructed other components in conjunction with the polysilicon diodes thus adding some limited control functions such as over current protection.

An example of a typical ESD protection structure commonly implemented on a CMOS IC is the circuit of FIG. 1a. There zener diodes 10.1 and 10.2 protect the gate of the N-mos power transistor 20 from very high voltages. Each zener diode pair is configured to point in opposite directions so that for current to flow in either direction across the pair, one zener breakdown voltage (plus one forward-biased diode drop) must be incurred. The reverse breakdown voltage in a zener diode is dependent upon the characteristics of the diode, but is typically much higher (on the order of several volts to tens of volts) than the forward-biased diode (on the order of 0.6 to 0.8 Volts). For extremely high voltages, the diode pair may conduct until the input voltage reaches a sufficiently low voltage so as to cause the pair to turn off. The zener diodes are fabricated such that they their reverse breakdown voltage plus one forward-biased diode drop is less than the rupture voltage for power transistor 20.

However, the use of polysilicon to produce a diode suitable for ESD protection circuitry has the disadvantages that the diodes are leaky, and thus a substantial leakage current may result. Others have proposed multiple polysilicon diode stacks with current limiting resistors between the stacks. See, for example U.S. Pat. No. 6,172,383. However, such proposals still have unacceptable leakage current. What the art needs is a protection circuit with limited or controlled leakage for normal operating conditions and ESD or high voltage protection for extraordinary conditions.

SUMMARY

The subject matter of this invention is an ESD protections circuit, in particular ESD protection circuit for a MOSFET or other power device with source, gate and drain terminals. The protection circuit has a primary and a secondary branch. The two branches are electrically in parallel with each other and are coupled between a gate input line and the source terminal. The primary branch has a small series buffer resistance and at least one pair of back to back (cathode to cathode) zener diodes. The back to back zener diodes set the breakdown voltage for the primary branch. The total voltage is thus the sum of the voltage drop across the series resistance, the reverse breakdown voltage of the first zener diode and the forward voltage drop across the second zener diode. The primary breakdown voltage is set slightly above the normal gate to source operating voltage of the device. For example, if the device operates at 8 volts, then the primary breakdown voltage will be set at about 11 or 12 volts.

The invention provides a second resistor termed a gate ballast resistor is disposed between the gate electrode and the secondary branches. The primary branch first buffer resistor cuts down the leakage current in the primary branch but its presence during an ESD event causes voltage to build up on the gate. The gate ballast resistor prevents that voltage build up and applies the voltage across the secondary branch which breaks down for high ESD.

The primary branch has a well-defined series resistance which serves two purposes. First, it reduces the current into the primary branch when the diode stack(s) in that branch breaks down. The voltage drop across the primary branch will increase proportional to the applied voltage due to the presence of the small resistance in the primary branch. That voltage will appear across the secondary branch. As the secondary branch approaches breakdown the ESD current will be shared by the two branches.

A second purpose is to reduce leakage current. The breakdown of the secondary branch is offset and greater than the breakdown voltage of the primary branch. As mentioned above, polysilicon diodes are leaky. When leakage is measured at 80% of the target gate rating (e.g. 8 volts) that same voltage appears across the secondary branch. Since the breakdown of the secondary branch is set higher than the breakdown voltage of the primary branch, the leakage generated from the secondary branch can be an order of magnitude lower than the leakage of the primary branch. In the case of DC voltage, the leakage value is comparable to leakage of a single diode.

The secondary branch has a higher breakdown voltage. In one embodiment, it includes two or more pairs of back to back zener diodes. Each pair of back to back zener diodes has an individual reverse zener diode breakdown voltage and a forward zener diode voltage drop. The breakdown voltage of the second branch is the reverse zener and forward zener voltage drops of the back to back pairs of zener diodes. In a typical embodiment, the breakdown voltage of the secondary branch is set to be between 15 and 20 volts or from two to three times the normal operating voltage. The second branch will conduct current away from the gate and protect the gate oxide from rupture before the applied gate voltage reaches a critical value. In other embodiments, the secondary branch includes a series ballast resistance.

BRIEF DESCRIPTION OF THE DRAWINGS

The present invention is disclosed with reference to the accompanying drawings, wherein:

FIG. 2b is a graph showing the performance of the circuit shown in FIG. 2a.

FIG. 8 shows a plan view of the integrated circuit shown in FIG. 2a.

The examples set out herein illustrate a few embodiments of the invention but should not be construed as limiting the scope of the invention in any manner.

DETAILED DESCRIPTION

Figure 1A:
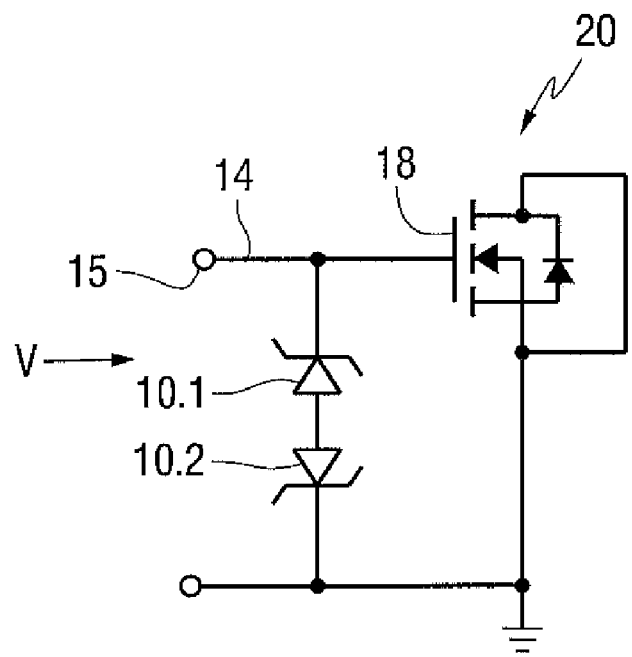
FIG. 1a is a schematic view of a single diode branch protective circuit with no series ballast resistor.
Figure 1B:
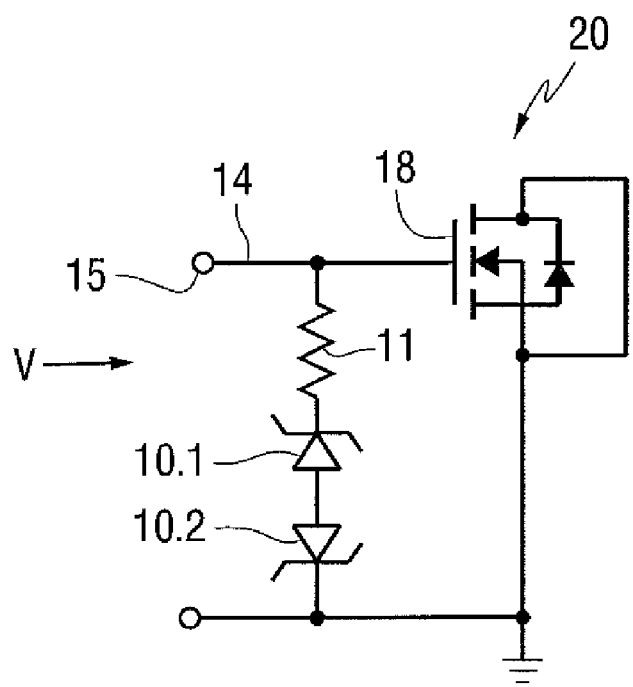
FIG. 1b is schematic view of a single diode branch protective circuit with a series ballast resistor.

FIG. 1a shows how a typical back to back diode stack without a series zener ballast resistance and FIG. 1b shows the same diode stack with a series zener resistance 11. In both figures the zener diode stack has cathode to cathode zener polysilicon diodes 10.1 and 10.2 coupled at one end to the drain of the mosfet 20 and at the other end to the gate input line 14. In FIG. 1b the stack 10 is connected via series zener ballast resistor 11 to the gate input line 14.

Figure 1C:
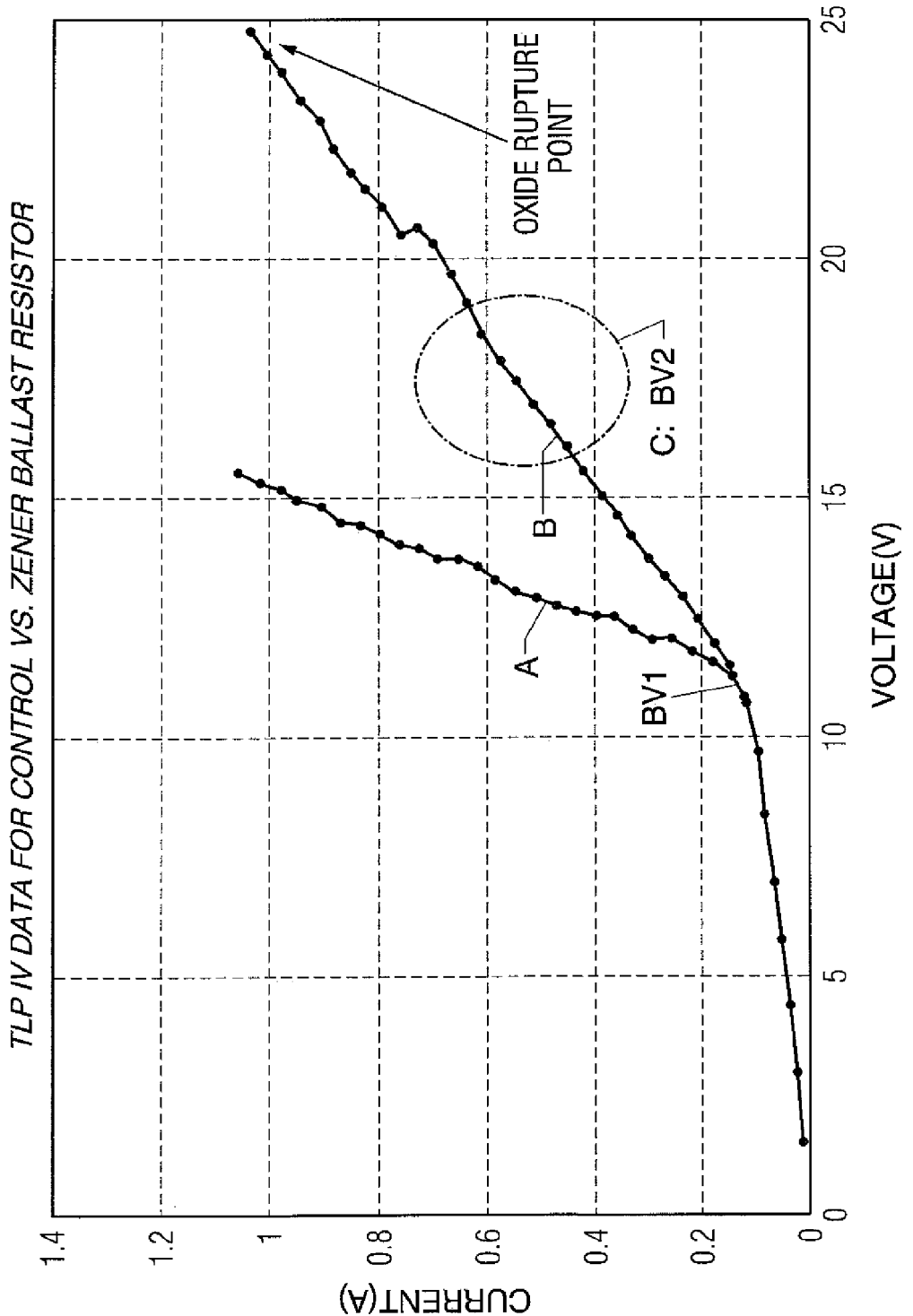
FIG. 1c is a graph showing the performance under test of the circuits shown in FIGS. 1a and 1b with the graphs A and B representing the results, respectively.

A voltage V is applied to the input terminal 15 and the results of two trials are shown in FIG. 1c. There a first graph A shows results when no series zener ballast resistance 11 is used and a second graph B representative of results when a series zener ballast resistance 11 as shown in FIG. 1b is used. When there is no series zener ballast resistance, the breakdown voltage of the diode stack in graph A is about 12 volts (BV1) and at 15 volts, the current rises rapidly to 1 amp. The sharp knee in the curve at 12 volts indicates the quick response time of the diode stack. However, the stack 10 generates substantial leakage current, especially for breakdown voltages as low as 13 or 14 volts. When a series zener ballast resistance 11 is added to the diode stack, the leakage current is much less. See graph B. It shows that when the diode stack of FIG. 1b has a series zener ballast resistance 11 as low as two ohms, the current at 15 volts is only 0.4 amps or 60% less than the current for a the diode stack without a series zener ballast resistance.

Figure 2A:
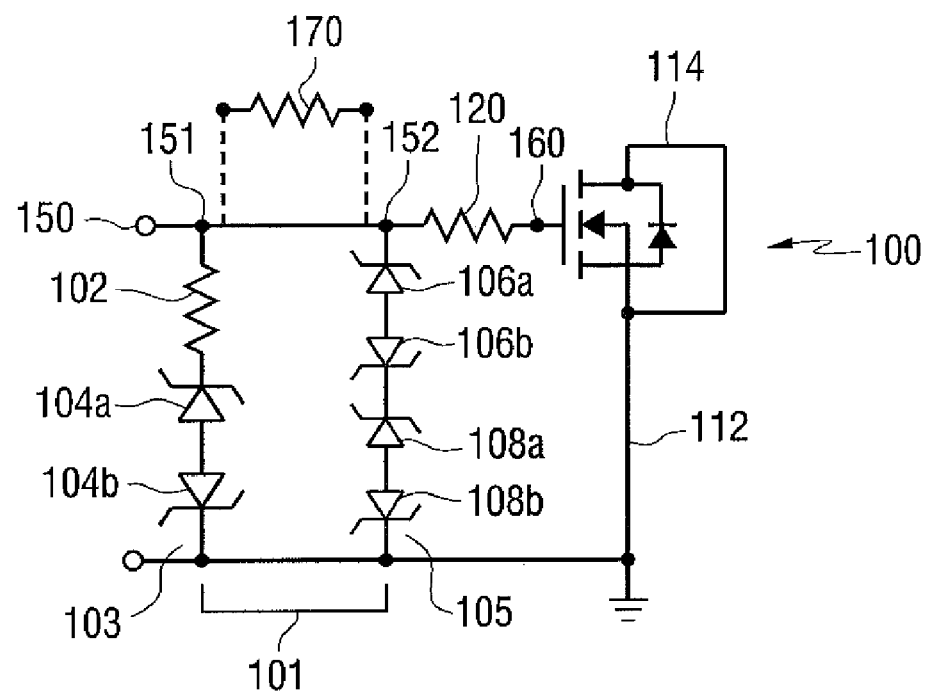
FIG. 2a is a schematic view of one embodiment of the present invention.

Turning to FIG. 2a, there is shown one embodiment of the invention. The input terminal 150 is connected via nodes 151 and 152 to first and second branches 103, 105. The output terminal 160 of the protection circuit is connected to the gate of the power mosfet. One or more optional resistors, e.g. 170 may be disposed between the nodes 151, 152 that connect the branches 103, 105 to the gate line that extends from the input terminal 150 to the output terminal 160. The protected device 100 is a MOSFET with a gate region 110, a source region 112, and a drain region 114. The gate 110 has an electrode of metal or a highly doped polysilicon. Underneath the gate electrode is an insulating layer, typically a layer of silicon dioxide. The gate oxide layer is over a channel region disposed between the source and drain and on the silicon.

The ESD protection network 101 has primary and secondary parallel branches 103, 105. These branches 103, 105 are placed so as to protect the gate oxide. The gate oxide layer is a vulnerable component in the semiconductor device, and the gate oxide is susceptible to rupture where there is a surge of voltage. The first branch 103 is the primary branch. The primary branch has a breakdown voltage set to the target gate protection rating, typically this is in the range of 8-25V. The primary branch contains a zener ballast resistor 102 and two cathode to cathode zener diodes 104a, 104b. The diodes and resistors are polysilicon. The primary branch 103 is substantially identical to the corresponding gate to drain structure shown in FIG. 1b. As mentioned above, the primary branch has two purposes. The first purpose is to reduce the current into the branch, thereby functioning as a ballast resistor. The second purpose is to increase the voltage across the branch as it conducts more current at breakdown.

The secondary branch 105 has a higher breakdown voltage than the first or primary branch 103. The secondary branch 105 has four zener diodes 106a, 106b, 108a, 108b. The voltage appears across the secondary branch 105, and as it approaches the breakdown voltage of this branch, it will begin to conduct current. The two branches share a common path leading to the source 114. Voltage is dissipated by removing voltage that could rupture the gate and allowing voltage to travel across the branches to ground, thereby protecting the device.

A gate ballast resistor 120 is connected between the secondary branch 105 and the gate electrode. As mentioned above, as voltage builds up on the gate, the gate ballast resistor applies that voltage to the secondary branch and thus protects the gate for transient high voltages generated by the zener ballast resistor 102.

Figure 2B:
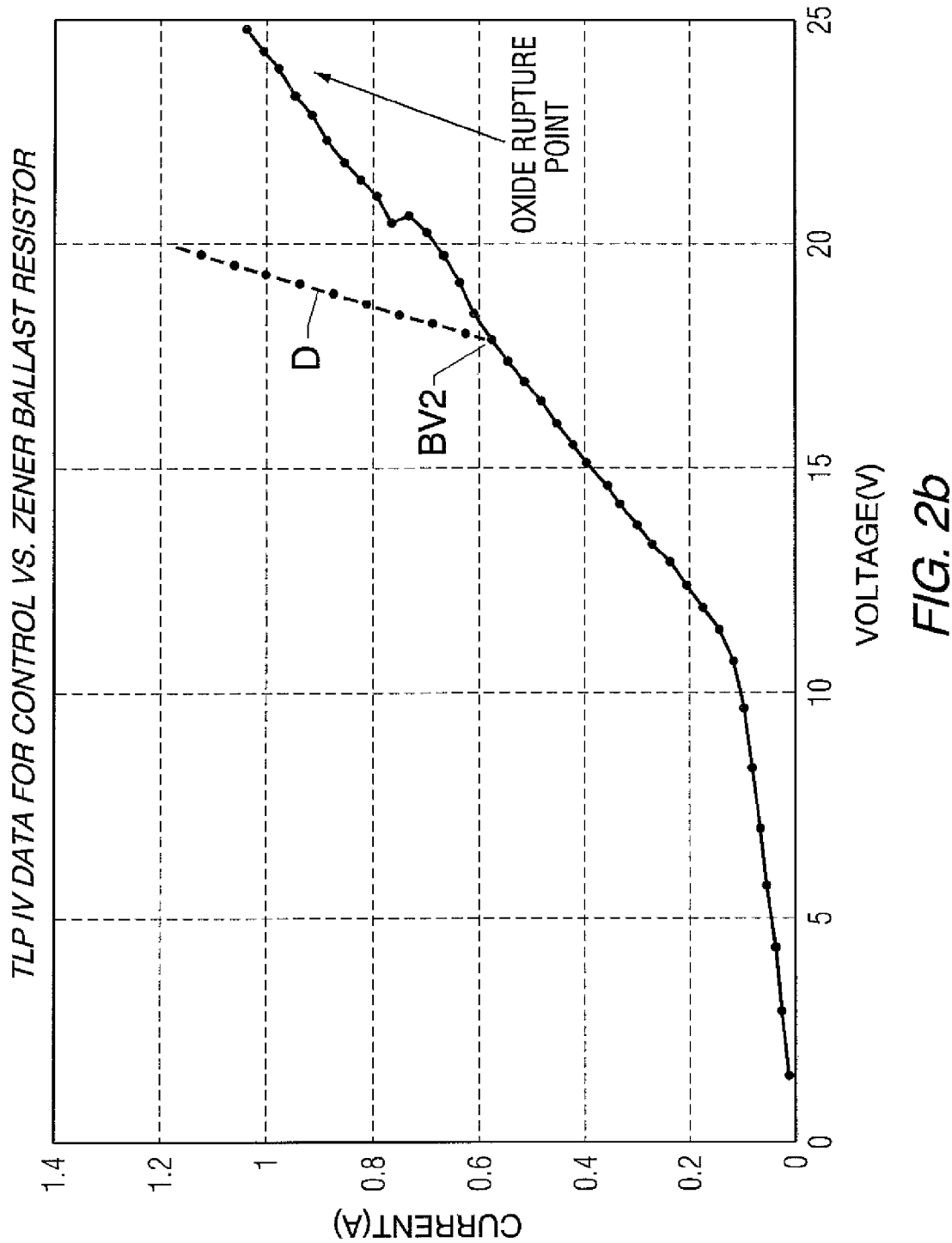

Graph B of FIG. 1c is instructive of how to add the secondary branch of two pair of back to back diodes 106a, 106b, 108a, 108b to protect the mosfet 100. Note the circled region C with the notation BV2. Between 15 and 20 volts, the second branch should breakdown and rapidly conduct current away from the gate before the voltage on the gate reaches the gate rupture voltage (about 40 volts). In order to achieve this result the diode stack comprising two pair of back to back diodes 106a, 106b, 108a, 108b create the secondary branch 105. The breakdown voltage (BV2) of that branch is constructed to be between 15 and 20 volts. Thus, at, for example, 17 volts, the secondary branch will breakdown and the current will be shorted to ground. The section of the graph in FIG. 2b labeled D shows how the circuit behaves when the applied voltage exceeds BV2. In summary, at a voltage over about 12 volts (BV1) the primary branch breaks down and begins conducting. The current carried to ground continues to rise gently along the slope of the graph B of FIG. 2b. At the breakdown voltage (BV2) of the secondary branch, about 17 volts, the protection circuit realizes that the applied voltage is not a small transient but may be the beginning of a larger ESD pulse. Accordingly, at BV2, the secondary branch breaks down and higher current is shunted to ground. However, shunting more current to ground, the protection circuit protects the gate from experiencing a rupture voltage.

Figure 3:
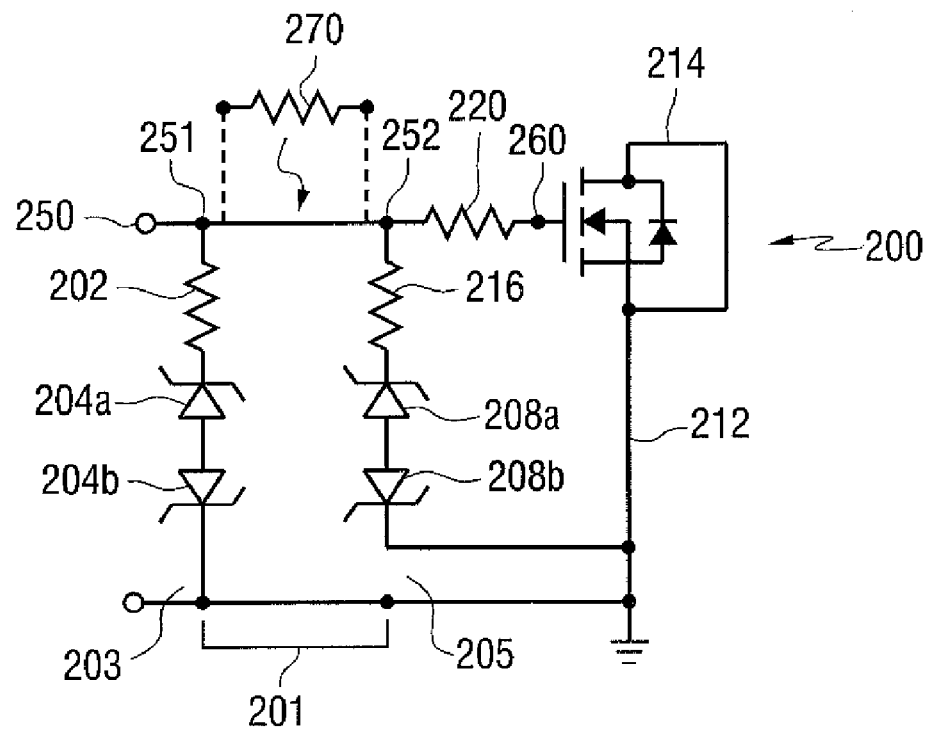
FIG. 3 is a schematic view of an embodiment of the present invention.

Referring to FIG. 3, there is another embodiment of the device. The input terminal 250 is connected via nodes 251 and 252 to first and second branches 203, 205. The output terminal 260 of the protection circuit is connected to the gate of the power mosfet. One or more optional resistors, e.g. 270 may be disposed between the nodes 251, 252 that connect the branches 203, 205 to the gate line that extends from the input terminal 250 to the output terminal 260. The protected device is a MOSFET with a gate region 210, source region 212, and drain region 214. In this embodiment, the diode network 201 has two parallel branches 203, 205, each having its own path leading to the source region 212. The first branch 203 has a series ballast resistor 202 and two zener diodes 204a, 204b. The second branch 205 has the same configuration, which is a series ballast resistor 206 and two zener diodes 208a, 208b. Again, the second branch 205 has a higher breakdown voltage than the first branch 203. This voltage appears across the secondary branch and as it approaches the breakdown voltage of this branch, it will begin to conduct current, and the total current will now be shared between the two branches. The significance of offsetting the breakdown voltage is for the benefit of leakage. When the leakage is measure at 80% of the target gate rating, 8V for example, this voltage also appears across the secondary branch. Since the secondary branch has a higher breakdown voltage, the leakage generate by the secondary branch can be an order of magnitude lower than the leakage current in the primary branch. Again, the ESD protection network uses polysilicon diodes and resistors.

A gate ballast resistor 220 is connected between the secondary branch 205 and the gate electrode. As mentioned above, as voltage builds up on the gate, the gate ballast resistor applies that voltage to the secondary branch and thus protects the gate for transient high voltages generated by the zener ballast resistor 202.

Figure 4:
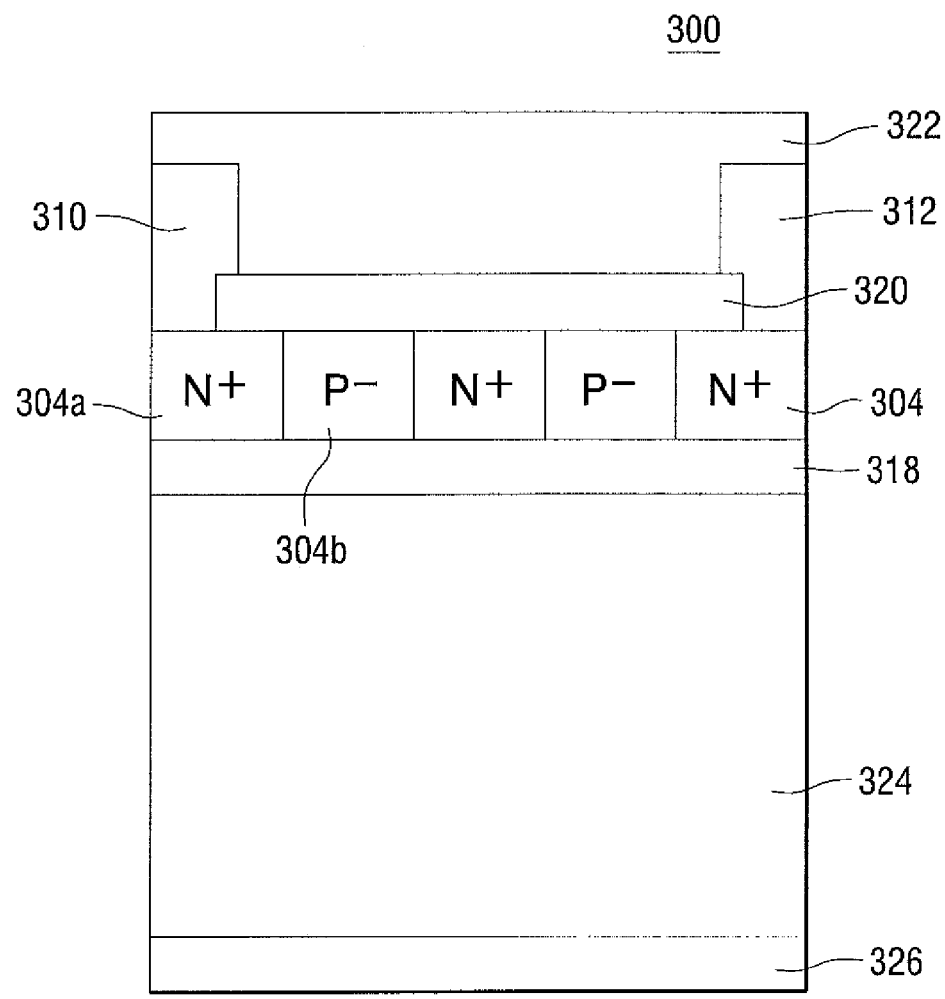
FIG. 4 is a cross-sectional view of a device with a polysilicon diode.

Referring to FIG. 4, there is a partial cross-sectional view of a device 300 embodying the present invention. The gate electrode 310 is separated from the source electrode 312 by a passivating layer 322. In addition, there is an inter-layer dielectric (ILD) layer 320 between the gate electrode 310 and the source electrode 312. Below the ILD layer 320 is a portion of the diode structure 304 with alternating N+ regions 304a and P− regions 304b. Under the diode structure 304 is a field oxide layer 318. Further, under the field oxide layer 318 is the substrate 324. Lastly, there is a thermal contact 326 at the bottom of the device from this perspective.

The ESD protection network shown in these various embodiments can be used in all active and passive devices. For instance, the device has been shown in MOSFET devices, but may also be used in thyristors, bipolar junction transistors, and insulated gate bipolar transistors. It will be understood by those skilled in the art that other devices may use the disclosed ESD protection network.

Figure 8:
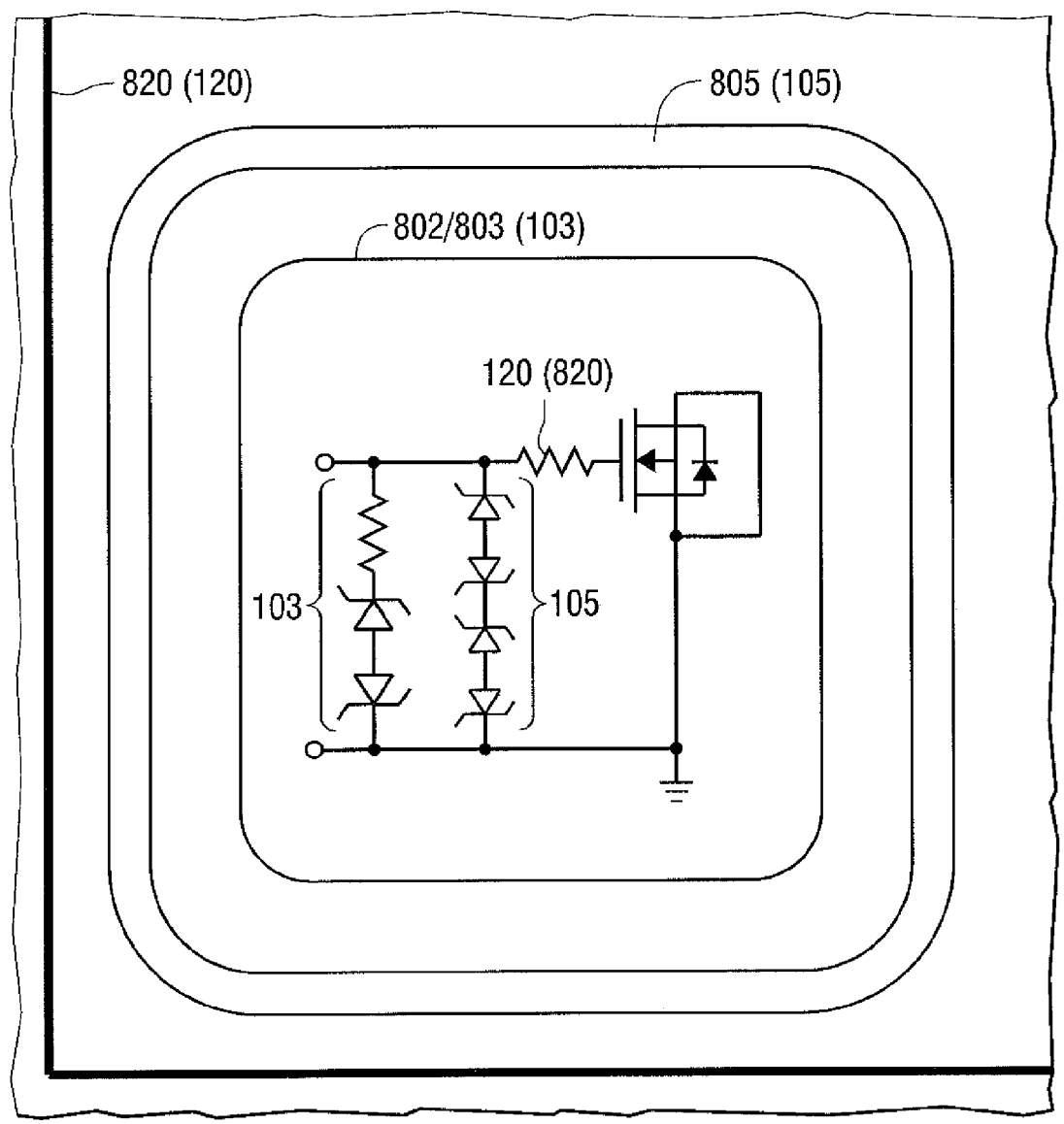

FIG. 8 shows a plan layout of the circuit 100. The first branch 103 with diodes 104a, 104b and resistor 102 are formed in the inner ring 803/802 and the second branch 105 composed of diodes 106a,b and 108a,b are in the outer ring 805. The zener series ballast resistor 102 is about 4 ohms and is indicated by trace line 802; the gate ballast resistor 120 is represented by trace line 820. Internal source metal forms ground connections. Those skilled in the art understand that one or more diode rings made be added to the structure of circuit 200 to provide a three or more secondary branches to further handle an ESD event.

Figure 5:
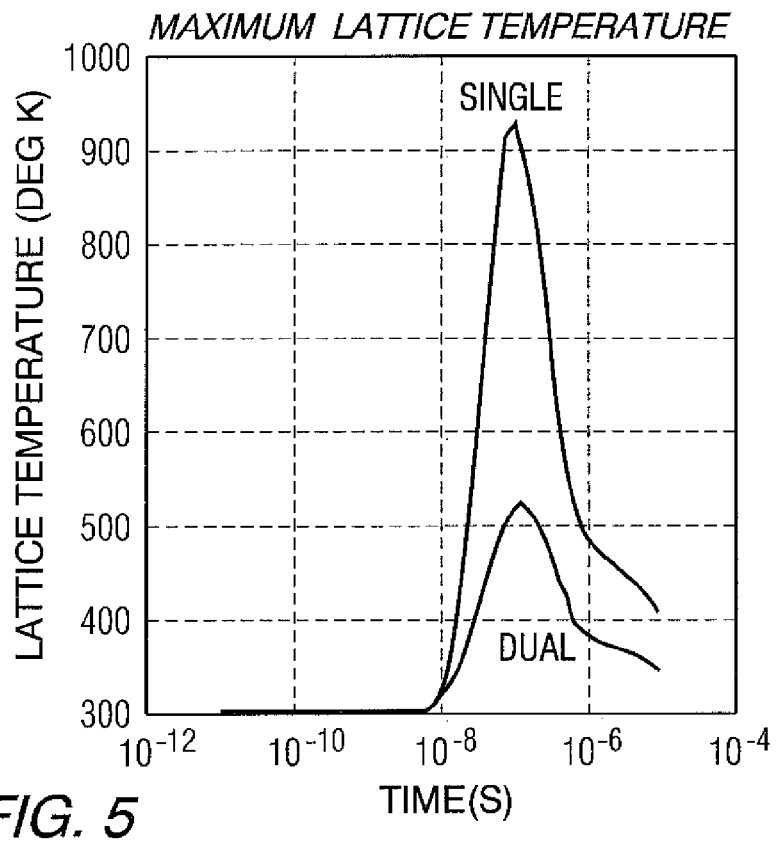
FIG. 5 is a graphical depiction of lattice temperature over time in a control device with a single diode branch and a device embodying the present invention.
Figure 6:
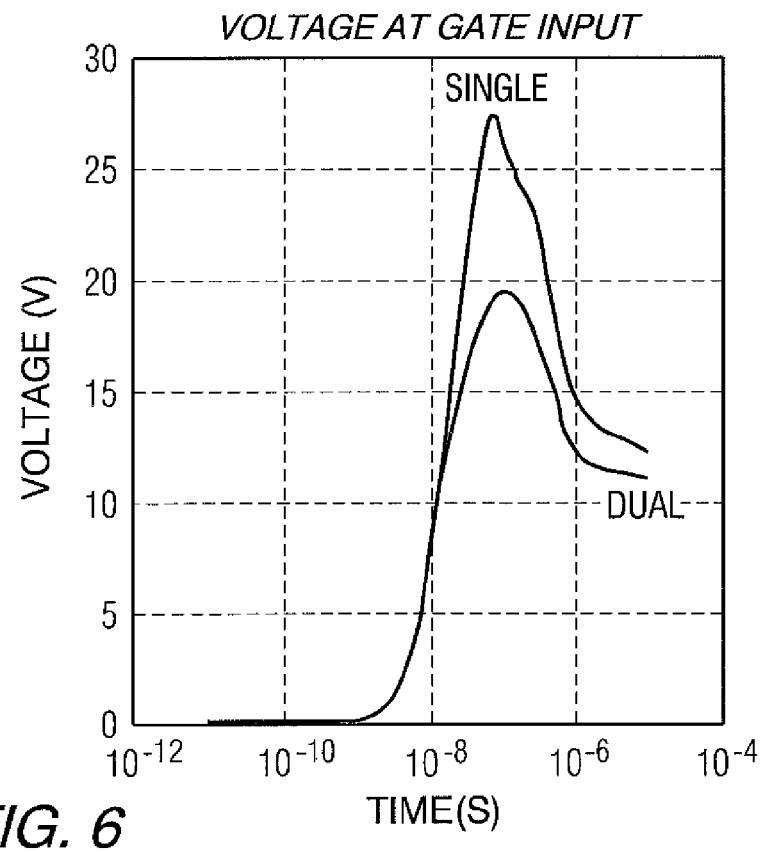
FIG. 6 is a graphical depiction of voltage at gate input in a control device with a single diode branch and a device embodying the present invention.
Figure 7:
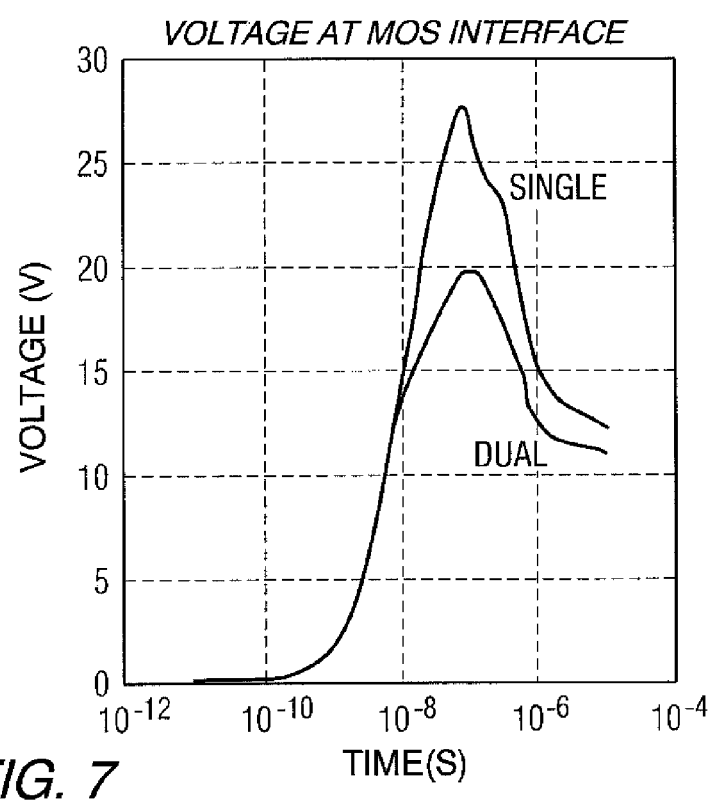
FIG. 7 is a graphical depiction of voltage at MOS-interface in a control device with a single diode branch and a device embodying the present invention.

FIG. 5 is a graphical illustration of Maximum Lattice Temperature. It has two traces. One trace shows the expected lattice temperature for a device with a single branch and the other trace shows the expected lattice temperature for a device with parallel branches as described above. As is visible in the illustration, the lattice temperature is greatly reduced in the device with the dual branch diode network as compared to the device with a single diode branch. In particular, the device with a single branch has lattice temperature over 900 degrees Kelvin, with a rapid rise incline to that temperature. The device using the parallel branches has a maximum temperature of slightly over 500 degrees Kelvin with a more moderate rise over time to that temperature. The reduced lattice temperature increases the operability of the device, thereby creating an advantage over the prior art. Referring to FIGS. 6 and 7, the graphs represent the voltage at gate input and MOS-interface, respectively. Both figures show that the second branch of the diode network helps to clamp voltage to about 20V. The device with single diode branch have a peak between 26-28V.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention. For example, the protection circuits of the invention may have more than two branches. However, the breakdown of the entire protection circuit is set by the lowest breakdown voltage of all the branches. In the preferred embodiment the branch closest to the input node is the normally selected to be the controlling branch and it will have the lowest breakdown voltage. Other branches may have breakdown voltages equal to or greater than the first branch.

Therefore, it is intended that the invention not be limited to the particular embodiments disclosed herein for carrying out this invention, but that the invention will include all embodiments falling within the scope and spirit of the appended claims.

The invention claimed is:

1. An input protection circuit for a discrete power semiconductor device or a power semiconductor device integrated into a larger circuit, comprising:

an input terminal, a reference terminal and an output terminal for connection to a protected power semiconductor device;
a first branch coupled between the input terminal and the reference terminal comprising at least one pair of back to back zener diodes with a first breakdown voltage; and
one or more other branches coupled between the output terminal and the reference terminal, each other branch comprising at least one pair of back to back zener diodes with another breakdown voltage,
wherein at least one of the branches comprises a ballast resistor in series with the at least one pair of back to back zener diodes; and
wherein the other breakdown voltages are equal to or greater than the first breakdown voltage.

2. The input protection circuit of claim 1 wherein the protected power semiconductor device has a gate, a gate signal line connected between the input terminal and the output terminal for applying a voltage to the gate, a source and a drain.

3. The input protection circuit of claim 1 wherein one of the branches comprises two pairs of back to back zener diodes.

4. The input protection circuit of claim 3 further comprising a gate ballast resistor in series with the gate and the junction of the second branch and the gate signal line.

5. The input protection circuit of claim 4 further comprising a gate ballast resistor in series with the gate and the junction of the second branch and the gate signal line.

6. The input protection circuit of claim 4 wherein the ballast resistor(s) and zener diodes comprise polysilicon.

7. The input protection circuit of claim 1 wherein each of the branches comprises a ballast resistor in series with the at least one pair of back to back zener diodes.

8. The input protection circuit of claim 1 wherein either branch comprises two or more pairs of back to back zener diodes.

9. The input protection circuit of claim 1 further comprising a resistor connected between the first and second branches.

10. The input protection circuit of claim 9 further comprising three or more branches and a resistor connected between one or more pairs of adjacent branches.

11. The input protection circuit of claim 1 wherein the branches comprises polysilicon diodes.

12. In a power semiconductor device having gate, a gate signal line, a source and a drain terminals, an electrostatic discharge protection circuit comprising:
first and second branches disposed electrically in parallel with each other and having an input common node coupled to an input line to the gate and an output common node coupled to the source;
the first branch comprising at least one pair of back to back zener diodes and a series resistance and having a first breakdown voltage and a first leakage current;
the second branch comprising at least two or more pairs of back to back zener diodes with a second breakdown voltage greater than the first breakdown voltage and a second leakage current less than the first leakage current;
wherein at least one of the branches comprises a ballast resistor in series with the at least one pair of back to back zener diodes; and
a resistor between the gate terminal and a common terminal of the two branches.

13. The power semiconductor device of claim 12 wherein the branches are connected to the gate signal line and one or more resistors are disposed between the respective branch connections to the gate signal line.

* * * * *